United States Patent [19]

Gignoux

[11] Patent Number: 4,755,779
[45] Date of Patent: Jul. 5, 1988

[54] SYNCHRONOUS FILTER WITH SWITCHED CAPACITANCES

[75] Inventor: Michel Gignoux, Saint Paul de Varces, France

[73] Assignee: Commissariat a l'Energie Atomique, Paris, France

[21] Appl. No.: 929,172

[22] Filed: Nov. 10, 1986

[30] Foreign Application Priority Data

Nov. 13, 1985 [FR] France ................... 85 16745

[51] Int. Cl.$^4$ .............................. H03H 7/01
[52] U.S. Cl. ...................... 333/173; 328/151
[58] Field of Search .............. 333/173, 172, 214; 328/151; 330/109, 107, 51, 9, 69

[56] References Cited

U.S. PATENT DOCUMENTS

| 3,793,599 | 2/1974 | Coor | 333/173 |
| 4,319,207 | 3/1982 | Gignoux | 333/173 |
| 4,378,538 | 3/1983 | Gignoux | 333/173 |

FOREIGN PATENT DOCUMENTS 1400515 7/1975 United Kingdom .

OTHER PUBLICATIONS

Journal "Electronics Letters", vol. 15, Aug. 1979, No. 16.

Primary Examiner—Eugene R. LaRoche
Assistant Examiner—Seung Ham
Attorney, Agent, or Firm—Cesari and McKenna

[57] ABSTRACT

A synchronous filter for use as a narrow band, bandpass filter comprises a matching circuit receiving a signal to be filtered and supplying that signal to an output connected to filtering paths with switched capacitances connected in parallel. This filter also includes switches for switching the filtering paths, a summing circuit with inputs respectively connected to outputs of the filtering paths and a switch control circuit. Each filtering path has two identical filtering channels, each with a capacitance, connected to the switches. The switching control signals are symmetrical for the two channels of each path and staggered by T/2N. The sampling periods or cycles of the two channels of one path are equal to T/2.

7 Claims, 4 Drawing Sheets

SYNCHRONOUS FILTER WITH SWITCHED CAPACITANCES

BACKGROUND OF THE INVENTION

The present invention relates to a synchronous filter with switched capacitances. It applies to the filtering of a signal having a useful component associated with a significant background noise.

The filter according to the invention is of the band-pass type with a narrow band centered on the frequency of the useful components of the input signal. The center frequency of the pass band is determined by the frequency of the clock pulses controlling the switching of the capacitances. This filter has N pairs of channels, each channel having at least one capacitance to be switched.

The invention applies to the selection of a periodic or cyclic signal mixed with another signal, harmonic analysis, telecommunications, processing the signal in nuclear magnetic resonance, servocontrols, etc.

It is known that highly selective band-pass filters can be very easily produced by using structures with N switched paths, each having a resistor associated with a capacitor and switches, as will be shown in greater detail hereinafter. These structures can be reduced to a circuit equivalent to N paths, in which each path comprises at least one capacitor, associated with two switches, all the paths being connected to a common input resistor. This equivalent circuit is often called a filter with N paths with capacitance switching. The main advantage of this type of filter is that it has a "comb" response, a pass band with a regulatable width and can be frequency tuned due to the pulses of an external standard clock. In microelectronic technology, the latter property makes it possible to produce filters having an integratable structure. Filters with external frequency standards are much less sensitive than other filters to variations in the values of the elements forming the same.

The external regulating of their tuning frequency, as well as their synchronization by an external signal can be performed in a simple manner. The center frequency of the main tooth of the response curve of such "comb" filters is defined by the frequency of the pulses of the external clock.

Obtaining a very narrow pass band with a filter of this type requires an increase in the number N of paths of the filter. The increase in the number of paths of the comb filter simultaneously leads to an increase in the external control clock frequency which, for a given technology, can lead to a limitation of the high frequency of the filter.

It results from these observations that a switching filter has a pass band, whose narrowness is limited by the frequency of the switching signals.

Another objective which is sought in filters is to reject any parasitic signal or run-out, without causing any phase displacement between the input signal of said filter and the output signal thereof.

Most known filters introduce a phase displacement between the input signal and the output signal. However, there are so called synchronous switched capacitance filters, in which the synchronization is defined by the frequency of the control clock pulses of the switching operations of the filter paths. These known filters are more particularly described in IEEE JOURNAL OF SOLID STATE CIRCUITS, Vol SC18, No 6, December 1983, pp 753-761. They have the main feature of having a plurality of pass bands instead of one such band and this is very prejudicial in certain applications. Thus, if one of the pass bands is centered on a run-out, the latter is transmitted, which can be highly prejudicial in certain applications. Synchronous filters do not have the same equivalent pass band band width with respect to a periodic signal and a random signal, as is apparent from the book by Robert Miquel, entitled "Le filtrage numerique", editions Editest, February 1985, p 143.

In synchronous filtering, it is often useful to obtain an absence of response of the filter at a zero frequency and at even harmonics of the input signal. It is also useful to obtain a significant attenuation of the odd harmonics. These known switching synchronous filters unfortunately do not make it make it possible to meet all these requirements.

Known filters making it possible to partly meet the requirements regarding phase, elimination of even harmonics, attenuation of odd harmonics and elimination of run-out are described in the following journals :

- The JOURNAL AEG-BAND 25, 1971, No 4, pp 173 to 150 describes switching filters with N paths of the stop—go type. This type of filter suffers from the main disadvantage of having several pass bands and of not making it possible to obtain a signal filtered in phase with the input signal.
- IEEE JOURNAL OF SOLID STATE CIRCUITS, VOL SC15, No 3, June 1980, pp 301 to 305 describes a switching synchronous filter using switched capacitances, but whose structure does not make it possible to meet the phase and harmonic elimination requirements.
- IEEE TRANSACTIONS ON CIRCUITS AND SYSTEMS, VOL CAS 29, No 8, August 1982, pp 557 to 572 describes a switching filter with N paths and switched capacitances. This journal reveals the defects mentioned hereinbefore for this type of filter.

SUMMARY OF THE INVENTION

The object of the present invention is to obviate the disadvantages of switching filters, particularly with N paths, as well as certain disadvantages of filters using switched capacitances. It aims at providing a filter with N channel pairs, each channel having at least one switching capacitance, said N channel pairs being connected in parallel. It makes it possible to eliminate the even harmonics of the input signal, attenuate the odd harmonics with a more significant attenuation law than in filters with N paths or synchronous detection. Moreover, it can have an absence of response in the presence of an input signal, at zero frequency. Finally, it makes it possible to sample an input signal of period or cycle T at the Shannon limit frequency, which is 1/2t. It makes it unnecessary to use an anti-turnback device, which is not the case with sampling filters, which often require at their input such a device for turning back the input spectrum on itself and with a restoration device at their output.

The invention relates to a synchronous filter with switched filtering capacitances connected in parallel, comprising matching means receiving on one input a signal to be filtered of cycle T and supplying said signal to an output connected to inputs of filtering paths, the latter respectively having filtering means with switched capacitances, said filter also comprising means for switching the filtering means and connected to the latter, summing means having inputs respectively connected to outputs of the filtering means of each path for supplying the filtered signal to an output, and sampling means connected to the switching means in order to apply thereto switching control signals from the filtering means, wherein the filtering means of each path comprise two identical filtering channels per capacitance connected to the switching means, the switching control signals being symmetrical for the two channels of each path, said signals being phase displaced by T/2N between two successive paths and respectively having sampling periods or cycles of the two channels of a path equal to T/2.

According to another feature of the invention, the two filtering channels of each path comprise a common resistor, whereof one terminal is connected to the output of matching means, the switching means comprising first and second two-position switches, each of these channels comprising a capacitor, whereof one electrode is connected to a reference earth, another electrode of the capacitor of a first of the two channels being connected to the first terminal of the first two-position switch and to a first terminal of the second two-position switch, another electrode of the capacitor of a second of the two channels being connected to a second terminal of the first switch and to a second terminal of the second switch, a terminal common to the two positions of the first switch being connected to another terminal of the common resistor and a terminal common to the two positions of the first switch is connected to a corresponding input of the summing means, the switches having control inputs connected to the sampling means for receiving said control signals.

According to another feature of the invention, the two filtering channels of each path comprise a common resistor, whereof one terminal is connected to the output of the matching means, the two filtering channels, comprising a rotary capacitor with two electrodes, during the rotation of the capacitor, a first electrode is connected to another terminal of the common resistor and to a corresponding input of the summing means and a second electrode is connected to a reference earth, the rotation then bringing about a switching of these electrodes to connect the second electrode to the other terminal of the resistor and the corresponding input of the summing means and for connecting the first electrode to the reference earth, the switching means having rotation control means for the rotary capacitors with control inputs connected to the sampling means for receiving said control signals.

According to another feature, the two filtering channels of each path comprise an operational amplifier common to these two channels, whereof a first input is connected to the other terminal of the common resistor and whereof a second input is connected to a reference earth, an output of said operational amplifier being connected to a corresponding input of the summing means and a rotary capacitor with two electrodes, during the rotation of said capacitor, a first electrode is connected to the first input of the operational amplifier and a second electrode is connected to the output of the amplifier, rotation then bringing about a switching of these electrodes to connect the second electrode to the first input of the amplifier and the first electrode to the output of the amplifier, the switching means having rotation control means of the rotary capacitors with control inputs connected to the sampling means for receiving said control signals.

According to another feature, the common resistor is a pure resistor.

According to another feature, the common resistor is a resistor simulated by capacitance switching.

According to another feature, the switched capacitance is a rotary capacitor with a frequency higher than the frequency of the path switching control signals.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
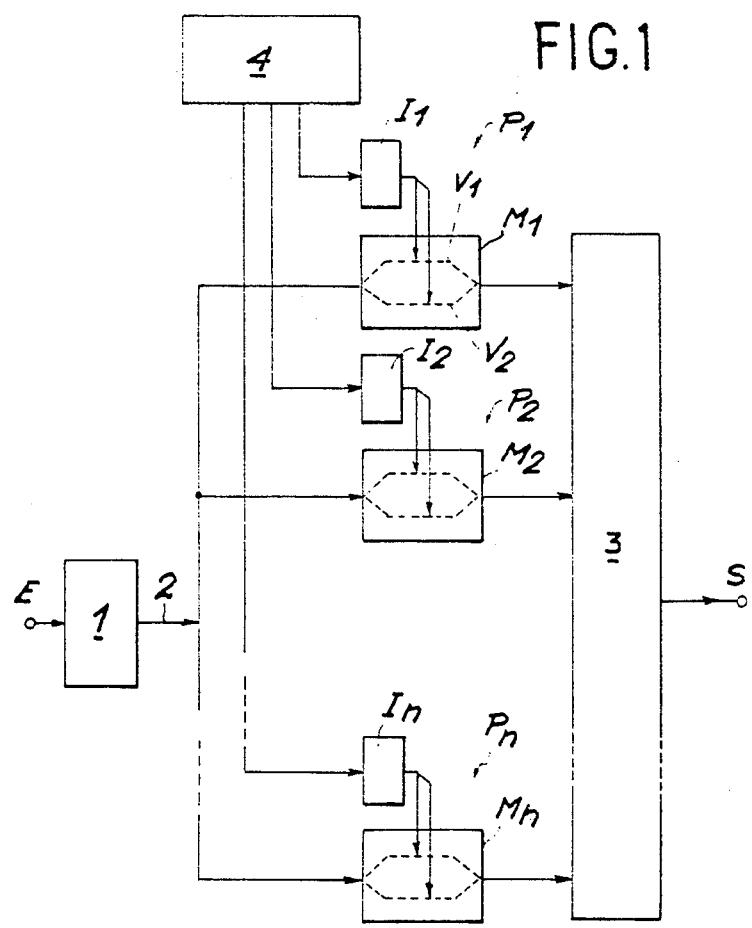
FIG. 1, diagrammatically a filter with N switched paths according to the invention.

FIG. 1 diagrammatically shows a filter with N pairs of channels connected in parallel and in accordance with the invention. The filter comprises matching means 1, which are formed, in the manner shown hereinafter, by an impedance matching amplifier. These means receive on an input E a signal to be filtered of period or cycle T, e.g. of a sinusoidal type. This signal is simultaneously applied by an output 2 of matching means 1 to inputs of the filtering paths $P_1, P_2, \ldots, P_N$. These filtering paths have pairs of filtering channels $M_1, M_2, \ldots, M_N$, which will be described in greater detail hereinafter. It also comprises means $I_1, I_2, \ldots, I_N$ for switching the channels and which are connected to the latter. Summing means 3 are simultaneously connected to outputs of the paths to supply the filtered signal on an output S. The filter also comprises sampling means 4 connected to the switching means $I_1, I_2, \ldots I_N$ in order to apply thereto channel switching control signals, which will be described hereinafter.

The filtering channels $M_1, M_2, \ldots, M_N$ of each channel are formed from two identical filtering channels $V_1, V_2$ connected to the corresponding switching means. As will be shown hereinafter, the switching control signals of the channels supplied by the sampling means 4 are respectively symmetrical signals for the two channels of each path. These signals are phase displaced by T/2N between two successive paths, the sampling periods of the two channels being equal to T/2. To facilitate understanding, the number of channels shown in the drawing has been limited to 3.

Figure 2:
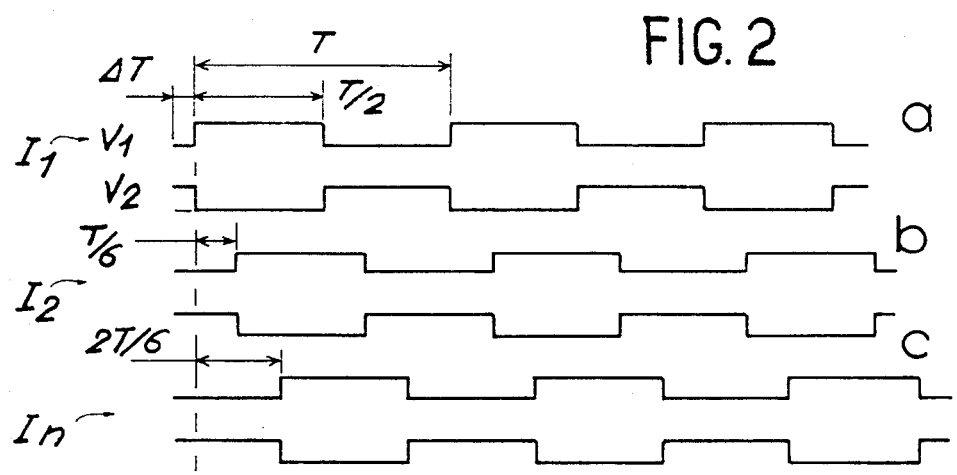
FIG. 2, a timing diagram of the switching control signals of the paths and channels of the filter.

FIG. 2 is a timing diagram of the switching control or sampling signals of the channels of the filter of FIG. 1. These signals are supplied by sampling means 4 and are applied to the switching means $I_1, I_2, \ldots, I_N$ for controlling the switching of the channels of each path. If the periodic input signal of the filter has as its period or cycle T, the sampling period or cycle of each channel of a path is equal to T/2. Diagram (a) in FIG. 2 represents the switching control signals applied to each of the filter channels $V_1$, $V_2$ by switching means $I_1$, controlled by sampling means 4. Diagrams (b) and (c) respectively represent the switching control signals applied to the two channels of path $P_2$ by control means $I_2$ and to the two channels of path $P_N$ by control means $I_N$. It can be seen that the switching control signals of the two channels of the same path are symmetrical, said signals being displaced by T/2N between two successive paths. In the example shown, the filter comprising three paths with two channels, the switching control signals of paths $P_2$ and $P_N$ are respectively phase displaced by T/6 and 2T/6 with respect to the switching control signals of the channels of path $P_1$.

These signals may or may not be phase displaced with respect to the signal to be filtered. In the example shown in the drawing, it is assumed that these signals are phase displaced by $\Delta T$ compared with the signal to be filtered. Despite this phase displacement, the signal at the output is in phase with the input signal.

Figure 3:
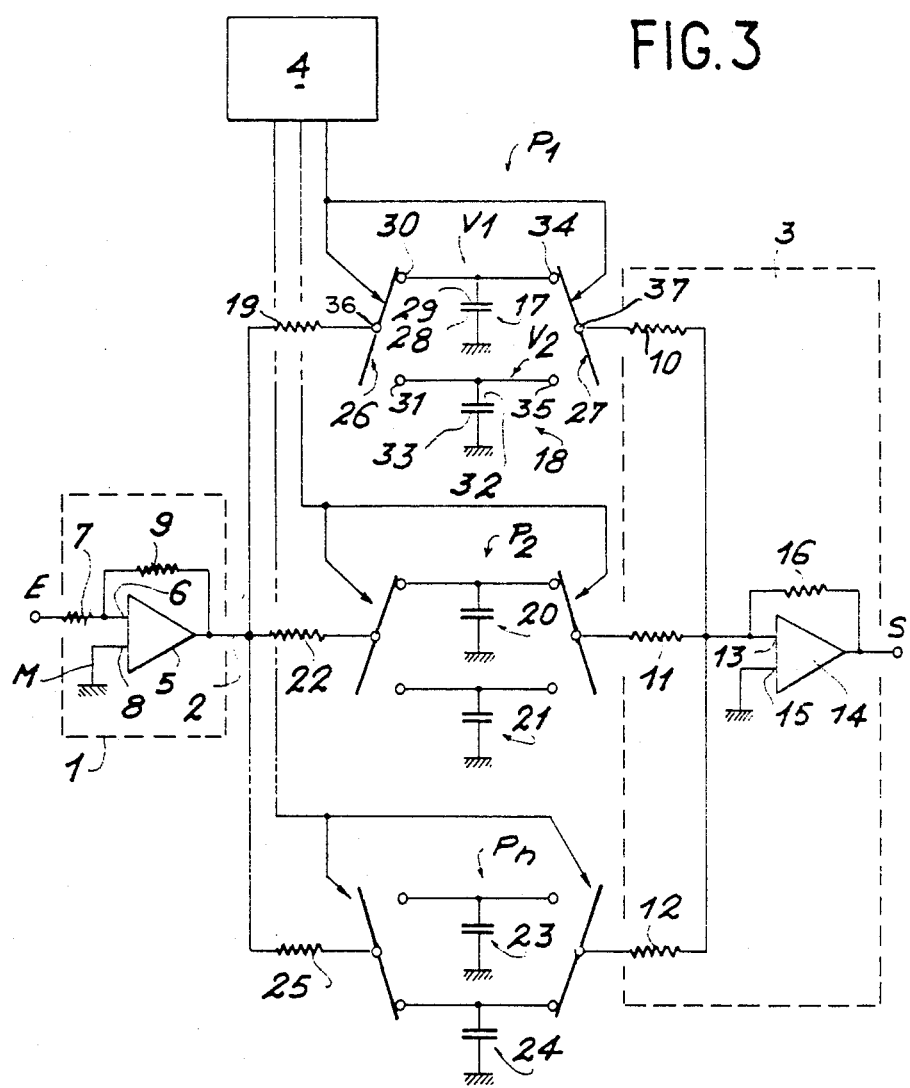
FIG. 3, diagrammatically a first embodiment of a filter according to the invention.

FIG. 3 shows a first embodiment of a filter according to the invention. The same elements carry the same references as in FIG. 1. The matching means 1 are shown in more detail here. They can e.g. be constituted by an operational amplifier 5 receiving the signal to be filtered on input 6, via a resistor 7. Another input 8 of this operational amplifier is connected to a reference earth M. Input 6 and output 2 of said amplifier are connected by a resistor 9. This matching circuit is known and its operation will not be described in detail here. E designates the filter input.

The summing means 3 have inputs connected to the outputs of the paths with two channels $P_1, P_2, \ldots, P_N$. These summing means are e.g. constituted by resistors 10, 11, 12 respectively connected to the outputs of the paths. All these resistors have the same value and are connected to an input 13 of an operational amplifier 14. Another input 15 of said amplifier is connected to reference earth. In per se known manner, the adding or summing means also have a resistor 16 connected to the amplifier input 13 and to output S. The filtering channels $V_1$, $V_2$ of each path respectively comprise capacitors 17, 18 and common resistor 19, as shown in the drawing, for channels $V_1$, $V_2$ of path $P_1$. In the same way, path $P_2$ has two filtering channels constituted by capacitors 20, 21 and the common resistor 22. Path $P_N$ also has two filtering channels constituted by capacitors 23, 24 and the common resistor 25. One terminal of each common resistor is connected to the output 2 of the matching means and all the common resistors have the same value. In this embodiment, the switching means comprise a first and a second two-position switch for each of the paths. Thus, for path $P_1$, the first switch is represented at 26, while the second switch is represented at 27. In each of the channels, each capacitor, such as e.g. 17, comprises an electrode 28 connected to reference earth. Another electrode 29 of said capacitor, for the first channel, is connected to a first terminal 30 of the first two-position switch 26. In the same way for the second channel $V_2$, one electrode 33 of capacitor 18 is connected to the reference earth, while another electrode 32 of said capacitor is connected to a second terminal 31 of the first switch 26. Electrode 29 of capacitor 17 is also connected to a first terminal 34 of the second two-position switch 27 and electrode 32 of capacitor 18 is connected to a second terminal 35 of the second switch 27. A common terminal 36 of the first switch 26 is connected to another terminal of the common resistor 19, while a common terminal 37 of the second switch 27 is connected to the corresponding resistor 10 of the summing means 3. These switches, which can e.g. be electronic, have control inputs connected to corresponding outputs of sampling means 4 for receiving the control signals described hereinbefore. The other paths $P_2$, $P_N$ shown are identically formed and will not be described in detail. The first and second switches of the channels in each path have an exclusive operation. If the first switch is closed in its first position 30, the second switch is also closed in its first position 34. In the same way, if the first switch is closed in its second position 31, the second switch is also closed in its second position 35.

Figure 4:
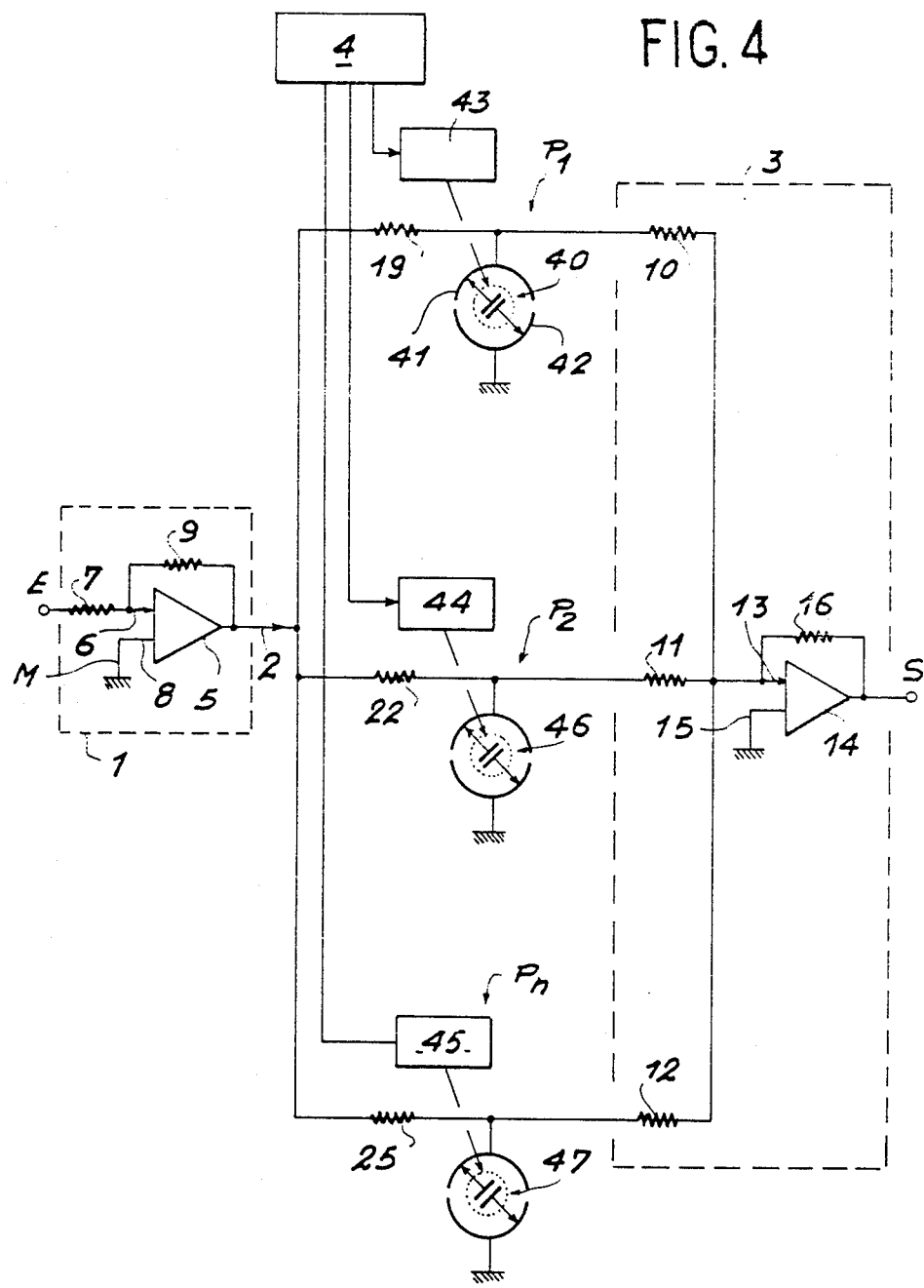
FIG. 4, diagrammatically a second embodiment of a filter according to the invention.

FIG. 4 diagrammatically shows a second embodiment of a filter according to the invention. The same elements carry the same references as in FIG. 3. In this embodiment, the matching means 1 and summing means 3 are identical to those of FIG. 3. Each path $P_1$ or $P_2 \ldots P_N$ has two switching channels respectively comprising a common resistor connected to a so-called rotary capacitor, such as e.g. capacitor 40, which has two electrodes 41, 42. Each of the channels is defined by one of the two positions of the corresponding capacitor. Each common resistor 19 has a terminal connected to the output 2 of matching means 1. During the rotation of capacitor 40, a first electrode 41 thereof is connected to another terminal of common resistor 19, as well as to a corresponding input of summing means 3. In the embodiment shown in the drawing, this input is one of the terminals of resistor 10. A second electrode 42 of capacitor 40 is connected to reference earth. The rotation of the capacitor then causes a switching of electrodes 41, 42, so that the second electrode 42 is then connected to the other terminal of the common resistor 19 and to the corresponding input of summing means 3 and so that the first electrode 41 is then connected to reference earth. The switching means for paths $P_1$, $P_2$, $P_N$ for this second embodiment are respectively constituted by rotation control means 43, 44, 45 of rotary capacitors 40, 46, 47. These rotation control means receive the aforementioned switching control signals supplied by the sampling means 4. In this embodiment, each electrode of the rotary capacitor is alternatively switched from one terminal of common resistor 19 to the reference earth. The latter can be a non-zero potential, provided that the same applies regarding the reference potential of amplifier 5.

The "rotation" of each rotary capacitor is in fact an imaged representation of the operation of this capacitor. Thus, the electrodes or capacitor plates can be fixed and the rotation can be likened to a switching of the electrodes or capacitor plates.

Figures 5, 6:
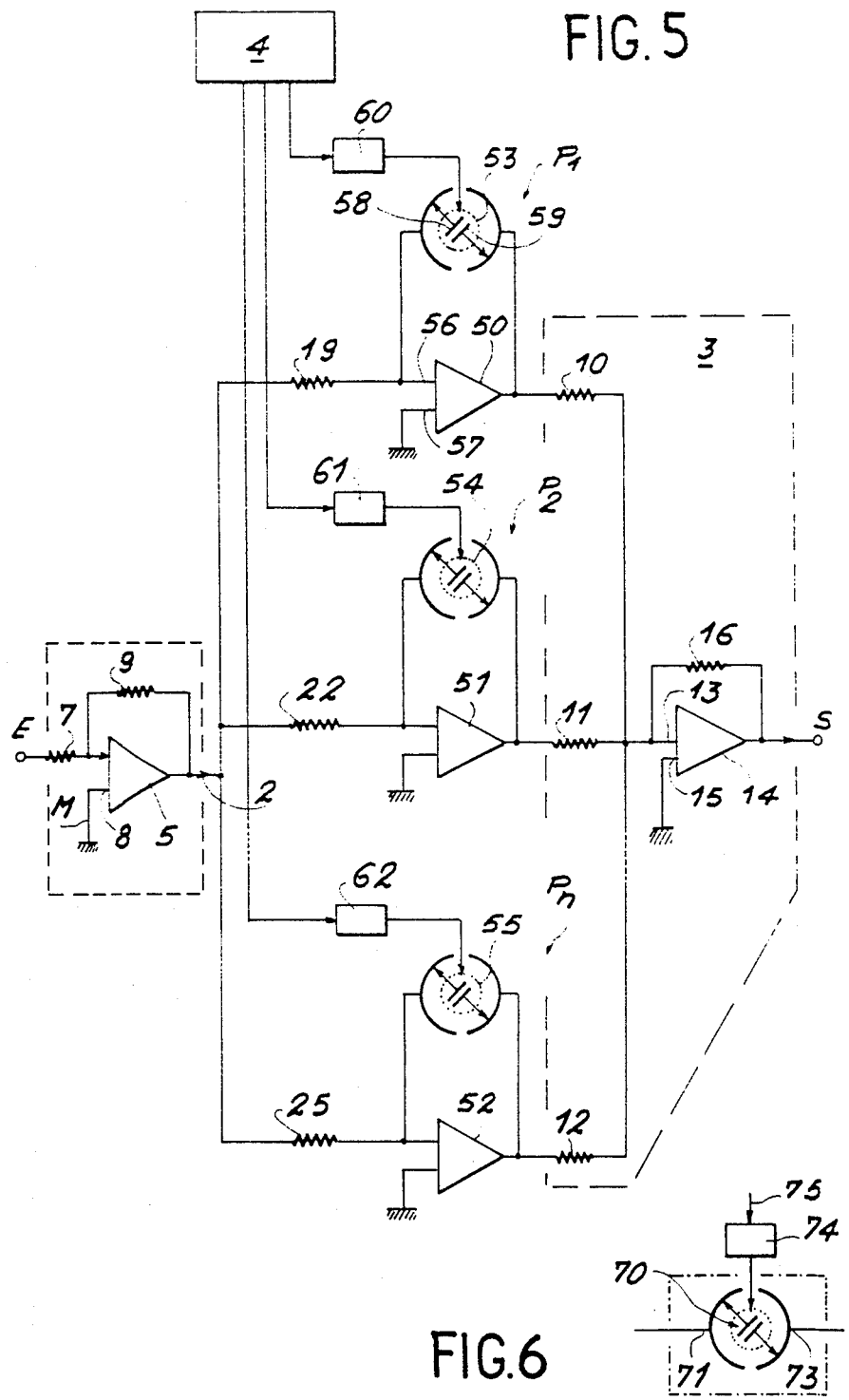
FIG. 5, diagrammatically a third embodiment of a filter according to the invention.
FIG. 6, diagrammatically another embodiment of a filtering resistor used in each of the paths of the filter according to the invention.

FIG. 5 diagrammatically shows a third embodiment of a filter according to the invention. The same elements carry the same references as in FIGS. 3 and 4. Matching means 1 and summing means 3, which have already been described, will not be described again here. Here again, each of the paths $P_1, P_2, \ldots, P_N$ has two filtering channels which, for each path, comprise a common resistor. These common resistors are indicated at 19, 22 and 25. The two filtering channels of path $P_1$, for example, comprise an operational amplifier, whose output is connected to one of the inputs by a rotary capacitor. One of the two positions of the capacitor defines a filtering channel. The operational amplifiers for the filtering channels of the embodiments shown are designated 50, 51, 52, while the associated rotary capacitors are designated 53, 54, 55. As in the preceding embodiments, the common resistors 19, 22, 25 comprise a terminal connected to the output of matching means 1. Each of the resistors, e.g. resistor 19, comprises another terminal connected to a first input 56 of the corresponding operational amplifier 50. A second input 57 of said operational amplifier is connected to a reference earth. The output of said amplifier is connected to one of the inputs of the summing means 3 (one of the terminals of resistor 10). With the corresponding common resistors 19, 22, 25, the rotary capacitors 53, 54, 55 form the two filtering channels of each path. During the rotation of e.g. capacitor 53, a first electrode 58 thereof is connected to the first input 56 of the operational amplifier 50, while a second electrode 59 thereof is connected to the output of said amplifier. The rotation of the capacitor then brings about a switching of these electrodes for connecting the second electrode 59 to the first input 56 of the operational amplifier and for connecting the first electrode 58 to the output of said amplifier 50. As in the second embodiment, the switching means can be constituted by means 60, 61, 62 for controlling the rotation of the rotary capacitors 53, 54, 55. These control means have inputs connected to sampling means 4 for receiving the aforementioned switching control signals. As in the preceding embodiment, the electrodes of the rotary capacitors are alternately switched between the first input of the corresponding operational amplifier and the output thereof.

In the embodiments of FIGS. 3, 4 and 5, it has been assumed that the common resistors 19, 22, 25 are pure resistors. FIG. 6 diagrammatically shows another embodiment of the common filtering resistors 19, 22, 25 used in each of the paths of the filter according to the invention.

Thus, it is possible, in the preceding embodiments to replace the common resistors 19, 22, 25 by circuits or connections called resistor simulated by capacitors, one of which is shown in FIG. 6. In this case, the common resistor is simulated by a rotary capacitor 70. One of the terminals 71 is connected to the output 2 of matching means 1, while the other terminal 73 is connected to the common point of the two channels of each path. This common point can either be the common terminal of one of the first switches of FIG. 3, or one of the two parts of the "carcass" or plates of the corresponding capacitors in the second embodiment of FIG. 4, or the input of the corresponding operational amplifier in the embodiment of FIG. 5. The switching of the capacitor is controlled by control means 74 receiving sampling or switching control or sampling signals on an input 75. The operation of these capacitors simulating a resistor is well known in the art and will not be described in detail. It is obvious that other resistor simulating means could be considered. The sampling signals applied to the input 75 make it possible to simulate a resistor by a capacitor. These signals can be supplied by sampling means 4. The frequency of these signals is higher than that of the path switching control signals making it possible to control the switching of the channels and the filter paths.

In all the embodiments described hereinbefore, each of the elementary two-channel filters, in fact, constitutes a two-channel sampling—averaging means operating in two stages. Each elementary filter is sampled at the same frequency, but with a different phase dependent on the number of paths, as indicated hereinbefore. In principle, all the time constants are equal. In the embodiments using a pure common resistor and a rotary capacitor constituting the two channels of each path, the operation is as follows. During a half-cycle T/2 of the input signal, the rotary capacitor of each path makes it possible to obtain, in association with the corresponding common resistor, the mean value of the input signal, said capacitor storing said mean value for said half-cycle. At the end of said half-cycle, the potential at the terminals of the capacitor is e.g. equal to $V_1$.

At the following half-cycle, while still retaining the previously stored mean value $V_1$, the rotary capacitor is reversed and each of the electrodes is changed over. In association with the corresponding common resistor, this capacitor then makes it possible to obtain the mean value of the input signal during the following half-cycle, starting from the previously stored mean value $V_1$, but which is reversed ($-V_1$). In this way, if an input signal of cycle T is applied to the input of the elementary filter, it is sampled at the Shannon limit frequency. If this signal is strictly in phase with the sampling signals, each capacitor is charged to the mean value of the signal during a half-alternation of the input signal. If the input signal is in quadrature with the sampling signals, the mean value stored in the rotary capacitors is zero.

In general terms, by arranging N paths with two channels in parallel, each of these paths samples the input signal with the same sampling cycle T/2, but at times staggered by T/2N. The filtered signal obtained at the output S has a quasi-sinusoidal shape with a number TN of steps per cycle of the input signal.

The filter acts in the same way as synchronous filters because it favors the repetitive synchronous signals of the sampling frequency and eliminates the noise signals, whose mean value is then zero at all these frequencies. The signals obtained is restored in phase with the input signal, when the sampling cycle is equal to a half cycle of said input signal. However, said filter has one important difference compared with known filters with N paths, because it gives no response to even harmonics and at frequency zero, particularly for the embodiments of FIGS. 4 and 5. The odd harmonics are attenuated in a proportion well above that obtainable with known synchronous filters.

Another advantage compared with synchronous filters with N paths of a known type is that, in the invention, the elementary filters function simultaneously and not successively. This simultaneous operation makes it possible to increase the sensitivity of the filter.

The filter described hereinbefore makes it possible to extract a periodic signal from significant background noise and restore the fundamental thereof in phase with the input signal. This filter also has the advantage of not introducing any parasitic phase displacement when the ambient temperature varies. An experimental study on this filter shows that the phase displacement introduced by temperature variations of 30° C. is less than 1 milliradian. The filter can be produced entirely by integration of its components.

What is claimed is:

1. A synchronous filter with switched filtering capacitances connected in parallel, comprising matching means receiving on one input a signal to be filtered of period T and supplying said signal to an output connected to inputs of N filtering paths, said paths respectively comprising filtering means with switched capacitances, said filter also comprising means for switching the filtering means and connected to said filtering means, summing means having inputs respectively connected to outputs of the filtering means of each path for supplying the filtered signal to an output, and sampling means connected to the switching means in order to apply thereto switching control signals from the filtering means, wherein the filtering means of each path comprise two identical capacitive filtering channels connected to the switching means, the switching control signals being symmetrical for the two channels of each path, said signals being phase displaced by T/2N between two successive paths and respectively having sampling periods or cycles of the two channels of a path equal to T/2.

2. A filter according to claim 1, wherein the two filtering channels of each path comprise a common resistor, whereof one terminal is connected to the output of said matching means, the switch means comprising first and second two-position switches, each of these channels comprising a capacitor, whereof one electrode is connected to reference earth, another electrode of the capacitor of a first of the two channels being connected to a first terminal of the first two-position switch and to a first terminal of the second two-position switch, another electrode of the capacitor of a second of the two channels being connected to a second terminal of the first switch and to a second terminal of the second switch, a terminal common to the two positions of the first switch being connected to another terminal of the common resistor and a terminal common to the two positions of the first switch is connected to a corresponding input of the summing means, the switches having control inputs connected to the sampling means for receiving said control signals.

3. A filter according to claim 1, wherein the two filtering channels of each path comprise a common resistor, whereof one terminal is connected to the output of the matching means, the two filtering channels comprising a rotary capacitor with two electrodes, during the rotation of the capacitor a first electrode of the capacitor being connected to another terminal of the common resistor and to a corresponding input of the summing means and a second electrode of the capacitor being connected to a reference earth, the rotation then bringing about a switching of these electrodes to connect the second electrode of this capacitor to the other terminal of the resistor and the corresponding input of the summing means and for connecting the first electrode to the reference earth, the switching means having rotation control means for the rotary capacitors, control inputs of the switching means being connected to the sampling means for receiving said control signals.

4. A filter according to claim 1, wherein the two filtering channels of each path comprise an operational amplifier common to these two channels, whereof a first input is connected to the other terminal of the common resistor and whereof a second input is connected to a reference earth, an output of said operational amplifier being connected to a corresponding input of the summing means, and a rotary capacitor with two electrodes, during the rotation of said capacitor a first electrode of this capacitor being connected to the first input of the operational amplifier and a second electrode of this capacitor being connected to the output of the amplifier, the rotation then bringing about a switching of these electrodes to connect the second electrode to the first input of the amplifier and the first electrode to the output of the amplifier, the switching means having rotation control means of the rotary capacitors, control inputs of the switching means being connected to the sampling means for receiving said control signals.

5. A filter according to claim 2 or 3, wherein the common resistor is a pure resistor.

6. A filter according to claim 2 or 3, wherein said common resistor is a resistor simulated by capacitance switching.

7. A filter according to claim 6, wherein the switched capacitance simulating the common resistor is a rotary capacitor operating at a frequency above the frequency of the signals supplied by the sampling means controlling the switching of the channels of the paths.

* * * * *